(12) United States Patent
Wei et al.

(10) Patent No.: US 10,699,881 B2
(45) Date of Patent: Jun. 30, 2020

(54) IMPEDANCE MATCHING SYSTEM, IMPEDANCE MATCHING METHOD, AND SEMICONDUCTOR PROCESSING APPARATUS THEREOF

(71) Applicant: BEIJING NAURA MICROELECTRONICS EQUIPMENT CO., LTD, Beijing (CN)

(72) Inventors: Jing Wei, Beijing (CN); Xiaoyang Cheng, Beijing (CN); Xingcun Li, Beijing (CN); Gang Wei, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 16/086,641

(22) PCT Filed: May 3, 2016

(86) PCT No.: PCT/CN2016/080875
§ 371 (c)(1),
(2) Date: Sep. 20, 2018

(87) PCT Pub. No.: WO2017/161641
PCT Pub. Date: Sep. 28, 2017

(65) Prior Publication Data
US 2019/0108977 A1    Apr. 11, 2019

(30) Foreign Application Priority Data

Mar. 23, 2016  (CN) .......................... 2016 1 0169274
Mar. 23, 2016  (CN) .......................... 2016 1 0169506

(51) Int. Cl.
*H01J 37/32*    (2006.01)
*H01L 21/67*    (2006.01)
*H03H 7/38*    (2006.01)

(52) U.S. Cl.
CPC .. *H01J 37/32183* (2013.01); *H01L 21/67011* (2013.01); *H03H 7/38* (2013.01)

(58) Field of Classification Search
CPC ................ H01L 21/00; H01L 21/3065; H01L 21/67011; H01J 37/32; H01J 37/3214; H01J 37/3244; H01J 37/3183
(Continued)

(56) References Cited

U.S. PATENT DOCUMENTS 4,935,661 A * 6/1990 Heinecke .............. C23C 16/515
                                             313/231.31
9,337,000 B2 * 5/2016 Marakhtanov .... H01J 37/32183
(Continued)

FOREIGN PATENT DOCUMENTS

CN    1942045 A  *  4/2007
CN    1942045 A      4/2007
(Continued)

OTHER PUBLICATIONS

Machine translation of CN 1942045 (Year: 2017).*
(Continued)

*Primary Examiner* — Alexander H Taningco
*Assistant Examiner* — Syed M Kaiser
(74) *Attorney, Agent, or Firm* — Anova Law Group, PLLC

(57) ABSTRACT

An impedance matching system is provided. The impedance matching system includes: an impedance matching device arranged between a radio frequency (RF) power supply and a reaction chamber, adapted to connect the RF power supply to the reaction chamber through a switch, and configured to
(Continued)

automatically perform an impedance matching on an output impedance of the RF power supply and an input impedance of the impedance matching device; the switch and a load circuit, the switch being configured to enable the RF power supply to be selectively connected to the reaction chamber or to the load circuit; and a control unit configured to control the switch to connect the RF power supply to the reaction chamber or connect the RF power supply to the load circuit according to a preset timing sequence. The impedance matching device is configured to convert a continuous wave output of the RF power supply into a pulse output according to the preset timing sequence, and provide the pulse output to the reaction chamber. The preset timing sequence is obtained based on a frequency and a duty cycle of a pulsed RF signal required by a process.

20 Claims, 6 Drawing Sheets

(58) Field of Classification Search
USPC .......................................... 315/111.21, 111.31
See application file for complete search history.

(56) References Cited

U.S. PATENT DOCUMENTS

| | | | | |
|---|---|---|---|---|
| 9,337,804 | B2* | 5/2016 | Mason | H01J 37/32183 |
| 9,660,613 | B2* | 5/2017 | Van Zyl | H01J 37/32183 |
| 9,805,916 | B2* | 10/2017 | Konno | H01J 37/32165 |
| 2004/0234362 | A1 | 11/2004 | Iijima et al. | |
| 2004/0262146 | A1* | 12/2004 | Platt, Jr. | A61L 2/14 |
| | | | | 204/164 |
| 2004/0263412 | A1* | 12/2004 | Pribyl | H01J 37/32082 |
| | | | | 343/866 |
| 2010/0055342 | A1* | 3/2010 | Chiang | C23C 16/45534 |
| | | | | 427/535 |
| 2010/0213162 | A1 | 8/2010 | Mochiki et al. | |
| 2012/0123345 | A1* | 5/2012 | Felts | A61M 5/3129 |
| | | | | 604/187 |
| 2013/0209766 | A1* | 8/2013 | Felts | A61M 5/31513 |
| | | | | 428/216 |
| 2014/0106572 | A1* | 4/2014 | Xu | H01J 37/32091 |
| | | | | 438/714 |
| 2014/0132265 | A1* | 5/2014 | Waddell | G01R 33/543 |
| | | | | 324/310 |
| 2014/0162462 | A1* | 6/2014 | Trachuck | H05H 1/46 |
| | | | | 438/711 |
| 2017/0345621 | A1* | 11/2017 | Cheng | H01J 37/32 |
| 2017/0352523 | A1* | 12/2017 | Kasai | H05H 1/46 |

FOREIGN PATENT DOCUMENTS

| | | |
|---|---|---|
| CN | 101459098 A | 6/2009 |
| CN | 102831494 A | 12/2012 |
| CN | 104025266 A | 9/2014 |
| CN | 104349567 A | 2/2015 |
| JP | S6250472 A | 3/1987 |
| JP | 2009124687 A | 6/2009 |
| JP | 2012142285 A | 7/2012 |
| TW | 201349946 A | 12/2013 |
| TW | 201440140 A | 10/2014 |
| TW | I523417 B | 2/2016 |

OTHER PUBLICATIONS

The World Intellectual Property Organization (WIPO) International Search Report for PCT/CN2016/080875 dated Jun. 29, 2016 4 Pages.

* cited by examiner

IMPEDANCE MATCHING SYSTEM, IMPEDANCE MATCHING METHOD, AND SEMICONDUCTOR PROCESSING APPARATUS THEREOF

CROSS-REFERENCE TO RELATED APPLICATIONS

This application is a national phase entry under 35 U.S.C. § 371 of International Application No. PCT/CN2016/080875, filed on May 3, 2016, which claims priority to Chinese Patent Application No. 201610169506.4, filed on Mar. 23, 2016 and Chinese Patent Application No. 201610169274.2, filed on Mar. 23, 2016. The above enumerated patent applications are incorporated by reference herein in their entirety.

TECHNICAL FIELD

The present disclosure relates to the field of microelectronic processing technologies, and more particularly, to an impedance matching system, an impedance matching method, and a semiconductor processing apparatus thereof.

BACKGROUND

In plasma processing systems, RF (radio frequency) energy is transmitted into a reaction chamber by an RF power supply, to excite reaction gas in the reaction chamber to generate plasma containing a large number of active particles, and the plasma interacts with a wafer, thereby completing a process such as etching or deposition. In transmission of the RF energy, an output impedance of the RF power supply is typically 50 ohms, while an input impedance of the reaction chamber is not equal to 50 ohms. For this reason, in a case where the RF energy is directly transmitted into the reaction chamber, the RF energy may be reflected due to an impedance mismatching of the transmission path, causing that the reaction gas in the reaction chamber cannot be excited normally to generate the plasma. As such, a matching device connected between the RF power supply and the reaction chamber is required to ensure the normal transmission of the RF energy.

FIG. 1 is a functional block diagram of an existing matching device according to some embodiments of the present disclosure. Referring to FIG. 1, an RF system, which is configured to supply RF energy to a reaction chamber 60, includes an RF power supply 10 and a matching device 30. The RF power supply 10 has a pulse function. The matching device 30 is connected between the RF power supply 10 and the reaction chamber 60 and has an auto-matching function and a matching-position holding function. Specifically, the matching device 30 includes a detection unit 1, an impedance adjustment unit 2, a control unit 3, and two control motors 4 and 5. The detection unit 1 is configured to detect a signal on a transmission line at a front end of the impedance adjustment unit 2, and to transmit the signal to the control unit 3. The impedance adjustment unit 2 has an internal structure as illustrated in FIG. 2, in which two variable capacitors C2 and C3, a fixed capacitor C1, and fixed inductors L and L2 are included. The two control motors 4 and 5 are configured to respectively adjust the two variable capacitors C2 and C3 under the control of the control unit 3. At the beginning of a process, the RF power supply 10 is first switched into a continuous wave mode for outputting continuous wave power, and at the same time, the detection unit 1 transmits the input signal and the value of reflected power, which are detected in real time, to the control unit 3. The control unit 3 obtains adjustment amounts of the variable capacitors C2 and C3 based on a preset algorithm, and controls the two control motors 4 and 5 to adjust the two variable capacitors C2 and C3, respectively. In the adjustment process, the control unit 3 determines whether the value of reflected power, which is transmitted from the detection unit 1, is within a small threshold range. In a case where the value of reflected power is within the small threshold range, it is determined that the output impedance of the RF power supply 10 matches the input impedance of the matching device 30, and the impedance adjustment unit 2 is controlled to be in a hold mode in which the capacitance and other parameters of the two variable capacitors C2 and C3 are all kept unchanged, when the plasma remains stable. Meanwhile, the control unit 3 controls the RF power supply 10 to switch into a pulse wave mode for the process. After the process proceeds to a certain stage, the control unit 3 determines whether it is required to switch to a next process. If it is not required, the process continues until its end. If it is required, due to changes of all processing conditions, it is necessary to control the RF power supply 10 to switch into the continuous wave mode again and the matching device 30 performs the matching again. After completion of the matching, the impedance adjustment unit 2 is in the hold mode again, while the RF power supply 10 is switched into the pulse wave mode again for a new process. Rest processes are performed in a similar fashion until completion of all processes.

In actual applications, the above-described matching device 30 inevitably has the following problems.

First, an overshoot phenomenon may occur when the RF power supply 10 outputs the pulse power, causing a sudden change of the impedance of the RF system. Since the impedance adjustment unit 2 is in the hold mode while the RF power supply 10 is in the pulse wave mode, a response to the sudden change of the impedance cannot be made in time, so the impedance matching cannot be achieved continuously, which in turn affects the outcome of the process.

Second, a matching position of the impedance adjustment unit 2 in the continuous wave mode of the RF power supply 10 and that of the impedance adjustment unit 2 in the pulse wave mode of the RF power supply 10 are thought to be identical in default. In actual applications, however, the impedance of the RF system may be varied between these two modes under the same process conditions. As such, in a case where the matching positions are set to be identical in these two modes, the matching precision between the output impedance of the RF power supply 10 and the input impedance of the matching device 30 may be affected and the output impedance of the RF power supply 10 and the input impedance of the matching device 30 may even be mismatched. As a result, problems such as unstable matching and non-repeatable matching may occur, thereby affecting the outcome of the process.

SUMMARY

The present disclosure aims to address at least one of the technical problems existing in the prior art, and provides an impedance matching system, an impedance matching method and a semiconductor processing apparatus, which enables a continuous wave radio frequency (RF) power supply to simulate a pulse wave mode, thereby reducing the cost of the system and improving the economic benefit in addition to avoiding the overshoot phenomenon in loading the pulsed RF power signal into the reaction chamber.

To address one of the above problems, the present disclosure provides an impedance matching system which may include: an impedance matching device, arranged between a radio frequency (RF) power supply and a reaction chamber, adapted to connect the RF power supply to the reaction chamber through a switch, and configured to automatically perform an impedance matching on an output impedance of the RF power supply and an input impedance of the impedance matching device; the switch and a load circuit, the switch being configured to enable the RF power supply to be selectively connected to the reaction chamber or to the load circuit; and a control unit, configured to control the switch to connect the RF power supply to the reaction chamber or connect the RF power supply to the load circuit according to a preset timing sequence. The impedance matching device may be configured to convert a continuous wave output of the RF power supply into a pulse output according to the preset timing sequence, and provide the pulse output to the reaction chamber. The preset timing sequence may be obtained based on a frequency and a duty cycle of a pulsed RF signal required by a process.

As another technical solution, the present disclosure further provides an impedance matching method for performing an impedance matching on an output impedance of a radio frequency (RF) power supply and an input impedance of an impedance matching device. The impedance matching method may include: providing a load circuit and a reaction chamber; enabling the RF power supply to be selectively connected to the reaction chamber or connected to the load circuit according to a preset timing sequence, converting a continuous wave output of the RF power supply to a pulse output according to the preset timing sequence, and providing the pulse output to the reaction chamber; and automatically performing the impedance matching on the output impedance of the RF power supply and the input impedance of the impedance matching device, when the RF power supply is connected to the reaction chamber. The preset timing sequence may be obtained based on a frequency and a duty cycle of a pulsed RF signal required by a process.

As still another technical solution, the present disclosure further provides a semiconductor processing apparatus including the impedance matching system in any one of embodiments of the present disclosure, the radio frequency (RF) power supply and the reaction chamber.

According to the impedance matching system and the impedance matching method provided by the present disclosure, the RF power supply always operates in the continuous wave mode and switch between the connection of the RF power supply to the reaction chamber and the connection of the RF power supply to the load circuit is controlled according to the preset timing sequence, such that an actual power signal received by the reaction chamber is a pulse modulated RF power signal (i.e., a pulsed RF power signal). That is to say, the impedance matching system and method provided by the present disclosure can simulate an operating mode of a pulsed RF power supply by using a continuous wave RF power supply, and compared to the prior art, the cost of the system can be reduced and the economic benefits can be increased due to the absence of the pulsed RF power supply, while the overshoot phenomenon can be avoided when a pulsed RF power signal is loaded to the reaction chamber; moreover, since the impedance matching device is capable of automatically performing the impedance matching when the RF power supply is switched to be connected to the reaction chamber, the matching speed, matching precision and matching stability can be improved.

The semiconductor processing apparatus provided by the present disclosure adopts the impedance matching system provided by any one of the embodiments of the present disclosure, and thus can simulate an operating mode of a pulsed RF power supply by using a continuous wave RF power supply. Compared to the prior art, it also has the following benefits: the cost of the system can be reduced due to the absence of the pulsed RF power supply, while the overshoot phenomenon can be avoided when a pulsed RF power signal is loaded to the reaction chamber; moreover, since the impedance matching device is capable of automatically performing the impedance matching when the RF power supply is switched to be connected to the reaction chamber, matching precision and matching stability can be improved.

DETAILED DESCRIPTION

Figure 1:
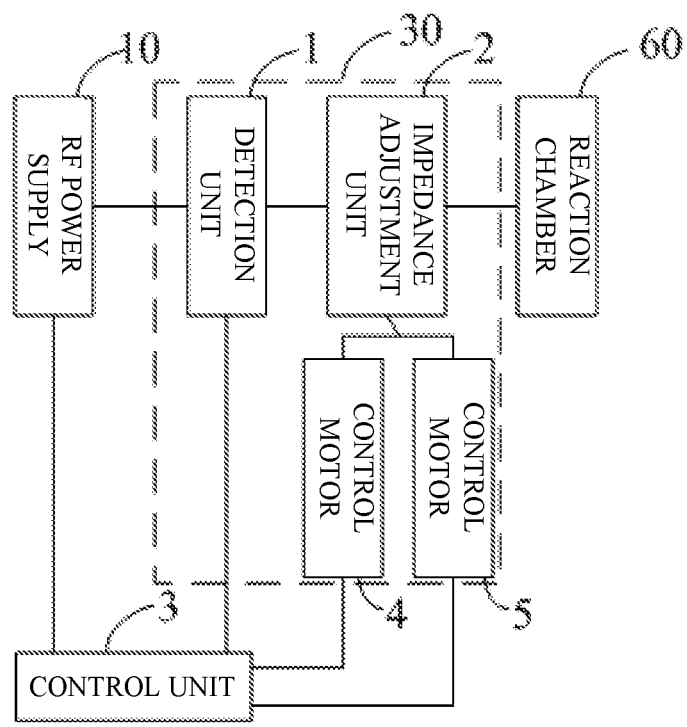
FIG. 1 is a functional block diagram of an existing matching device.
Figure 2:
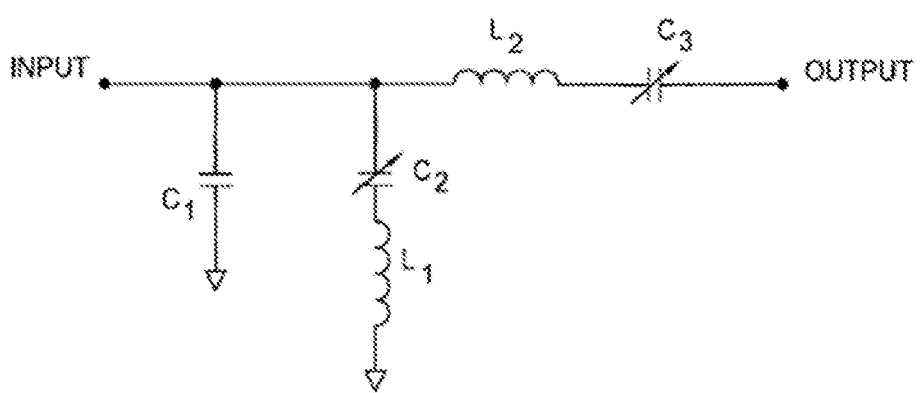
FIG. 2 is a schematic diagram illustrating an internal structure of an impedance adjustment unit according to some embodiments of the present disclosure.

To make those skilled in the art better understand the technical solutions of the present disclosure, the impedance matching system, the impedance matching method and the semiconductor processing apparatus according to the present disclosure will be described below in detail in conjunction with the accompanying drawings.

In some embodiments, the present disclosure provides an impedance matching system which includes an impedance matching device, a selector switch, a load circuit and a control unit. The impedance matching device is connected with an RF power supply and a reaction chamber, respectively, and configured to automatically perform impedance matching on an output impedance of the RF power supply and an input impedance of impedance matching device. The load circuit is configured to provide an additional load for the RF power supply in addition to the reaction chamber.

The selector switch is configured to enable the RF power supply to be selectively connected to the reaction chamber or to the load circuit. The control unit is configured to control the selector switch to connect the RF power supply to the reaction chamber or to the load circuit based on a preset timing sequence, such that an electric signal in the form of a pulse wave is loaded to the reaction chamber (i.e., the reaction chamber operates under the pulse wave mode). As such, the electric signal loaded to the reaction chamber can be in the form of the pulse wave, even though the RF power supply always operates in a continuous wave mode.

The preset timing sequence may be set in such a manner that a frequency and time of the connection between the RF power supply and the reaction chamber and a frequency and time of the connection between the RF power supply and the load circuit are calculated respectively, according to a pulse frequency and a duty cycle of the pulsed RF signal required by a process. The preset timing sequence is similar to a pulse modulation signal.

According to the impedance matching system in the embodiments of the present disclosure, the RF power supply always operates in the continuous wave mode, and a switch between the connection of the RF power supply to the reaction chamber and the connection of the RF power supply to the load circuit is controlled according to the preset timing sequence, such that an actual power signal received by the reaction chamber is a pulse modulated RF power signal (i.e., a pulsed RF power signal). That is, the impedance matching system provided by the present embodiment can have an operating mode of a pulse wave RF power supply by means of a continuous wave RF power supply. It has the following advantages over the conventional skills in the art: the cost of the system can be reduced to increase economic benefits due to the absence of the pulsed RF power supply, and it is possible to avoid the overshoot phenomenon caused by the pulsed RF power signal directly from the pulsed RF power supply being loaded to the reaction chamber. Moreover, since the impedance matching device is capable of automatically performing the impedance matching when the RF power supply is switched to be connected to the reaction chamber, the matching speed, matching precision and matching stability can be improved.

In the following, an impedance matching system provided by the present disclosure will be described in detail with reference to FIG. 3. In some embodiments, the selector switch is a change-over switch at least having one moving contact and two static contacts, and the control unit is further configured to set a matching position of the impedance matching device at an initial time point of a current connection between the RF power supply and the reaction chamber as a matching position of the impedance matching device at an ending time point of a previous connection between the RF power supply and the reaction chamber. As such, every time when the RF power supply and the reaction chamber are connected, the impedance matching device can achieve the matching quickly, thereby improving the impedance matching speed, and the stability and repeatability of the matching in a pulse mode.

Figure 3:
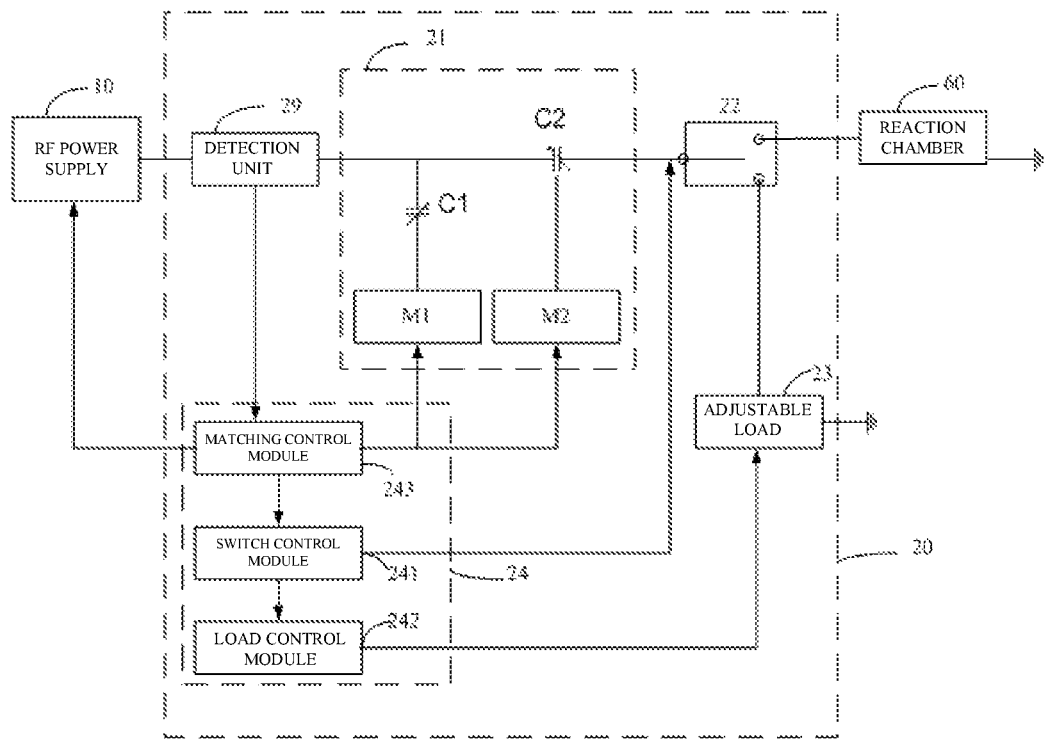
FIG. 3 is a functional block diagram of a first impedance matching system according to some embodiments of the present disclosure.

Referring to FIG. 3, an impedance matching system 20 may include an impedance matching device 21, a switch 22 (such as change-over switch), a load circuit, and a control unit 24. The impedance matching device 21 may be provided between an RF power supply 10 and a reaction chamber 60, and configured to automatically perform an impedance matching. The change-over switch 22 may include a moving contact connected with the RF power supply 10 and two static contacts. One of the two static contacts may be connected with a circuit (not shown) for connecting the reaction chamber 60 and the other may be connected with the load circuit. The change-over switch 22 may be configured to enable the RF power supply 10 to be selectively connected to the reaction chamber 60 or to the load circuit.

The load circuit is provided with an adjustable load 23, which may be connected in parallel with the reaction chamber 60 and further connected to a rear end of the impedance matching device 21 via the change-over switch 22. The so-called rear end is defined with respect to a transmission direction of the power in the circuit, i.e., the rear end is at an output end of the impedance matching device 21 in the transmission direction of the power. The control unit 24 may include: a switch control module 241 configured to control, according to a preset timing sequence, the change-over switch 22 to switch between a state in which the RF power supply 10 is connected to the reaction chamber 60 and a state in which the RF power supply 10 is connected to the load circuit. The control unit 24 may further include a load control module 242 configured to adjust an impedance of the adjustable load 23 to a preset impedance when the change-over switch 22 is switched to the state in which the RF power supply 10 is connected to the load circuit. The so-called preset impedance is an input impedance of the reaction chamber 60 at the ending time point of the previous connection between the RF power supply 10 and the reaction chamber 60.

Figure 4:
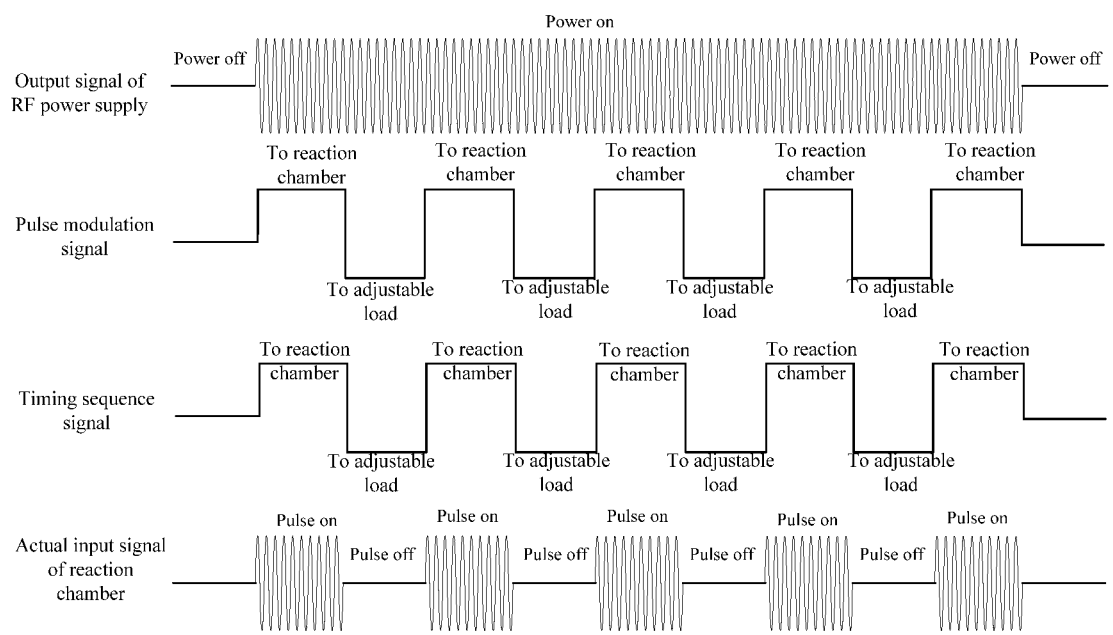
FIG. 4 is a timing diagram illustrating timing sequences of an output signal of an RF power supply in FIG. 3, a pulse modulation signal, a preset timing sequence signal and an actual input signal of a reaction chamber in FIG. 3.

The preset timing sequence is the same as a pulse modulation signal required by the process in its frequency and duty cycle, as illustrated in FIG. 4. When the pulse modulation signal is at a high level, the switch control module 241 controls the change-over switch 22 to switch to the state in which the RF power supply 10 is connected to the reaction chamber 60, and at this time, the reaction chamber 60 is capable of receiving an RF power signal. Moreover, when the pulse modulation signal is at a low level, the switch control module 241 controls the change-over switch 22 to switch to the state in which the RF power supply 10 is connected to the adjustable load 23, and at this time, the reaction chamber 60 cannot receive any RF power signal. Thus, an actual input signal of the reaction chamber 60 is illustrated in FIG. 4. That is, the reaction chamber 60 actually receives a pulse modulated RF power signal. Obviously, in actual applications, the switch control module 241 may be configured to control the change-over switch 22 to switch to the state in which the RF power supply 10 is connected to the reaction chamber 60 when the pulse modulation signal is at a low level, and to control the change-over switch 22 to switch to the state in which the RF power supply 10 is connected to the adjustable load 23 when the pulse modulation signal is at a high level.

The impedance matching system 20 may include a detection unit 29, the control unit 24 may further include a matching control module 243, and the impedance matching device 21 may include an impedance adjustment unit and an actuator unit. The impedance adjustment unit may be provided in the transmission line between the RF power supply 10 and the reaction chamber 60. The detection unit 29 may be configured to detect a signal, such as a voltage and a current, in the transmission line at a front end of the impedance adjustment unit, and to transmit the detected signal to the matching control module 243. The matching control module 243 may be configured to obtain a control signal based on the signal transmitted from the detection unit 29, and to transmit the control signal to the actuator unit. In some embodiments, the matching control module 243 may perform an impedance matching calculation to calculate a current load impedance of the RF power supply 10 based on the voltage signal and current signal transmitted from the detection unit 29, and compare the current load impedance with a characteristic impedance (typically, 50 ohms) of the RF power supply 10 to obtain the control signal. The actuator unit may be configured to adjust the impedance of the impedance adjustment unit based on the control signal, thereby achieving the impedance matching.

In some embodiments, the impedance adjustment unit may include adjustable capacitors C1 and C2; and the actuator unit may include drive motors M1 and M2 for adjusting capacitances of the adjustable capacitors C1 and C2 in the circuit, respectively.

In some embodiments, the input impedance of the reaction chamber 60 may be obtained in a manner as follows. The matching control module 243 may perform a calculation based on the obtained load impedance of the RF power supply 10 and the impedance of the impedance adjustment unit to obtain the input impedance of the reaction chamber 60.

Additionally, in some embodiments, the change-over switch 22 may have a preset initial state in which the change-over switch 22 is connected to the reaction chamber 60, and the matching control module 243 may be further configured to determine in real time, under the condition that the change-over switch 22 is in the initial state, whether the current matching is successful based on the signal transmitted from the detection unit 29. If the current matching is successful, the matching control module 243 may transmit a start-up instruction to the switch control module 241. Upon receipt of the start-up instruction, the switch control module 241 may start to control, according to the preset timing sequence, the change-over switch 22 to switch between the state in which the RF power supply 10 is connected to the reaction chamber 60 and the state in which the RF power supply 10 is connected to the adjustable load 23. If the current matching is not successful, the impedance matching is performed again.

From the above descriptions, it can be seen that, in the present disclosure, the impedance matching is achieved in the continuous wave mode and a pulse mode is entered. In some embodiments, an initial impedance of the adjustable load 23 may be preset to the input impedance of the reaction chamber 60 in a state where the matching is achieved under the condition that the change-over switch 22 is in the initial state. The initial impedance is obtained by performing a calculation based on the current impedance of the impedance adjustment unit and the characteristic impedance of the RF power supply 10 in the state where the matching is achieved. In other embodiments, the initial impedance of the adjustable load 23 may be obtained by performing a calculation based on the current load impedance of the RF power supply 10 and the current impedance of the impedance adjustment unit in the state where the matching is achieved.

In the following, how to achieve the impedance matching quickly in the pulse mode by the impedance matching system provided by the embodiments of the present disclosure will be described in detail with reference to FIG. 5. In the present embodiments, it is assumed that the change-over switch 22 at a high level may be configured to connect the impedance matching device 21 to the reaction chamber 60, the change-over switch 22 at a low level may be configured to connect the impedance matching device 21 to the adjustable load 23, and the preset timing sequence at a first time point is configured at a high level. Moreover, the impedance of the impedance matching device 21 is defined as MZ, and the impedance of the reaction chamber 60 is defined as $CZ_1$.

Figure 5:
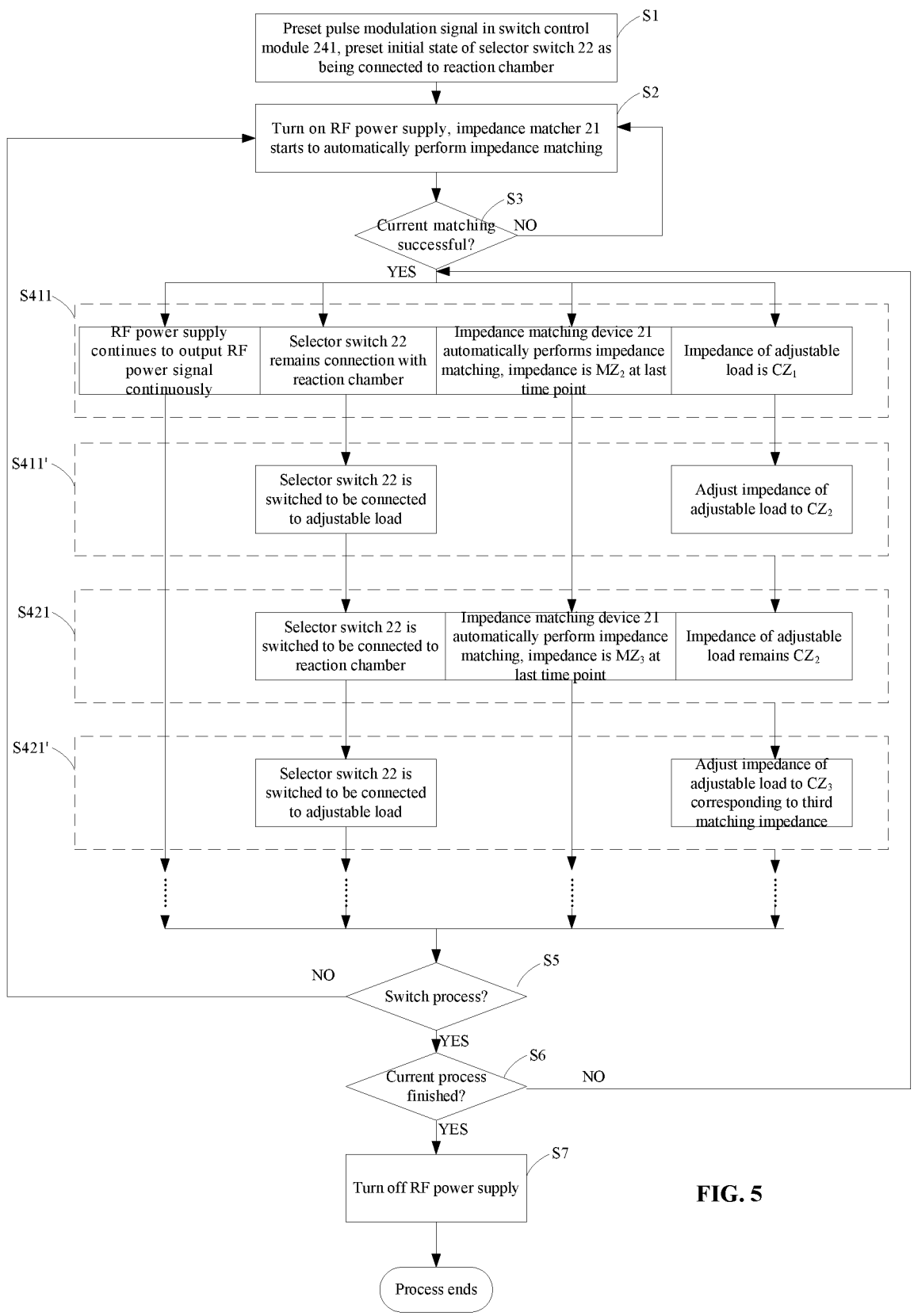
FIG. 5 is a flowchart illustrating operations of an impedance matching system according to some embodiments of the present disclosure.

Referring to FIG. 5, the procedure of the impedance matching in the present embodiments mainly includes the following steps.

At step S1, a preset timing sequence may be configured in advance in the switch control module 241 (i.e., parameters, such as a frequency, a duty cycle, etc. of the pulse modulation signal required by a process, may be preset in the switch control module 241), and the initial state of the change-over switch 22 may be preset as a state where the RF power supply 10 is connected to the reaction chamber 60.

At step S2, the RF power supply may be turned on, and the impedance matching device 21 may start to automatically perform the impedance matching.

At step S3, the matching control module 243 may determine whether the current matching is successful. If it is successful, a start-up instruction may be transmitted to the switch control module 241, the current impedance of the impedance matching device 21 is defined as $MZ_1$, the current impedance of the reaction chamber 60 is defined as $CZ_1$, and the procedure may proceed to step S4. If the current matching is not successful, the procedure may return to step S2.

At step S4, the switch control module 241 may receive the start-up instruction and start an operation to control the operation mode of the change-over switch 22, details of which will be described as follows.

At step S411, in a high level period of a first pulse, the change-over switch 22 may be configured to connect the impedance matching device 21 to the reaction chamber 60, and starting from $MZ_1$, the impedance matching device 21 may continue to automatically perform the impedance matching. The impedance of the impedance matching device 21 and the impedance of the reaction chamber 60 at the ending time point of the high level period of the first pulse are defined as $MZ_2$ and $CZ_2$, respectively.

At step S411', in a low level period of the first pulse, the change-over switch 22 may be controlled to connect the impedance matching device 21 to the adjustable load 23. An initial impedance of the adjustable load 23 is $CZ_1$. The load control module 242 may adjust the impedance of the adjustable load 23 from $CZ_1$ to $CZ_2$; and the impedance matching device 21 may continue to perform the impedance matching from $MZ_2$. Since the impedance of the adjustable load 23 is $CZ_2$ at the ending time point of the low level period of the pulse, the impedance of the impedance matching device 21 remains $MZ_2$ at the ending time point of the low level period of the pulse. That is to say, the matching position of the impedance matching device 21 is not changed after going through the low level period of the pulse.

At step S412, in a high level period of a second pulse, the change-over switch 22 may be switched to connect the RF power supply 10 to the reaction chamber 60, i.e., a matching target may be changed to the reaction chamber 60. The RF power supply 10 may continue to output the RF power signal continuously; the impedance matching device 21 may continue to automatically perform the impedance matching from $MZ_2$, and at the ending time point of the high level period of the pulse, the impedance of the impedance matching device 21 is defined as $MZ_3$, the impedance of the reaction chamber 60 is defined as $CZ_3$; and the impedance of the adjustable load 23 is kept unchanged as $CZ_2$.

At step S412', in a low level period of the second pulse, the change-over switch 22 may be switched to connect the RF power supply 10 to the adjustable load 23, and the RF power supply 10 may continue to output the RF power signal continuously. The load control module 242 may adjust the impedance of the adjustable load 23 from $CZ_2$ to $CZ_3$; and the impedance matching device 21 may continue to automatically perform the impedance matching from $MZ_3$. Since the impedance of the adjustable load 23 is $CZ_3$ at the ending time point of the low level period of the pulse, the impedance of the impedance matching device 21 remains $MZ_3$ at the ending time point of the low level period of the second pulse. That is to say, the matching position of the impedance matching device 21 is not changed after going through the low level period of the pulse.

Similarly, in a high level period of a subsequent N-th pulse, the RF power supply 10 may continue to output the RF power signal continuously, the change-over switch 22 may be switched to connect the RF power supply 10 to the reaction chamber 60; the impedance matching device 21 may continue to automatically perform the impedance matching from $MZ_N$, and at the ending time point of the high level period of the pulse, the impedance of the impedance matching device 21 is defined as $MZ_{N+1}$, and the impedance of the reaction chamber 60 is defined as $CZ_{N+1}$; the impedance of the adjustable load 23 is kept unchanged as $CZ_N$.

In a low level period of the N-th pulse, the RF power supply 10 may continue to output the RF power signal continuously; the change-over switch 22 may be switched to connect the RF power supply 10 to the adjustable load 23, and the load control module 242 may adjust the impedance of the adjustable load 23 from $CZ_N$ to $CZ_{N+1}$; and the impedance matching device 21 may continue to automatically perform the impedance matching from $MZ_{N+1}$. Similarly, since the impedance of the adjustable load 23 is $CZ_{N+1}$ at the ending time point of the low level period of the pulse, the impedance of the impedance matching device 21 remains $MZ_{N+1}$ at the ending time point of the low level period of the pulse. That is to say, the matching position of the impedance matching device 21 is not changed after going through the low level period of the pulse.

At step S5, the control unit 24 may determine whether it is required to switch to a next process currently, if a switch is required, the procedure may return to step S1. If it is not required to switch to a next process, the procedure may proceed to step S6.

At step S6, the control unit 24 may determine whether the current process is finished. If it is finished, the procedure may proceed to step S7. If it is not finished, the procedure may return to step S4.

At step S7, the control unit 24 may control the RF power supply 10 to be off, and the current process may end.

It should be noted that although the above step S4 has been described by taking an example in which it is at a high level in a first time period of the pulse mode, the present disclosure is not limited thereto. In actual applications, in step S4 above, it is also possible to be at a low level during a first time period of the pulse mode, to which the same procedure and principle can be applied, and details thereof will not be described herein.

It should also be noted that, in the present embodiments, the impedance matching is achieved in the continuous wave mode and a simulated pulse wave mode is entered. In actual applications, as long as the impedance of the reaction chamber 60 in a state where the impedance matching is achieved in the continuous wave mode is not much different from the impedance of the reaction chamber 60 in a state where the impedance matching is achieved in the pulse mode, the initial impedance of the adjustable load 23 can be set to the impedance of the reaction chamber 60 in the state where the impedance matching is achieved in the continuous wave mode as in the present embodiments, thereby achieving the matching quickly in the pulse mode.

Moreover, it should be noted that, in the present embodiments, the selector switch may be the change-over switch 22 at least having one moving contact and two static contacts, but the present disclosure is not limited thereto. In actual applications, the selector switch may also include two separate switches to be connected with the circuit between the reaction chamber 60 and the RF power supply 10 and connected with the circuit between the load circuit and the RF power supply 10, respectively. The switch control module 241 is configured to control the two separate switches to be turned on or turned off according to the preset timing sequence. In some embodiments, each of the separate switches may be an electronic switch such as a relay, a diode or an RF switch.

Figure 6:
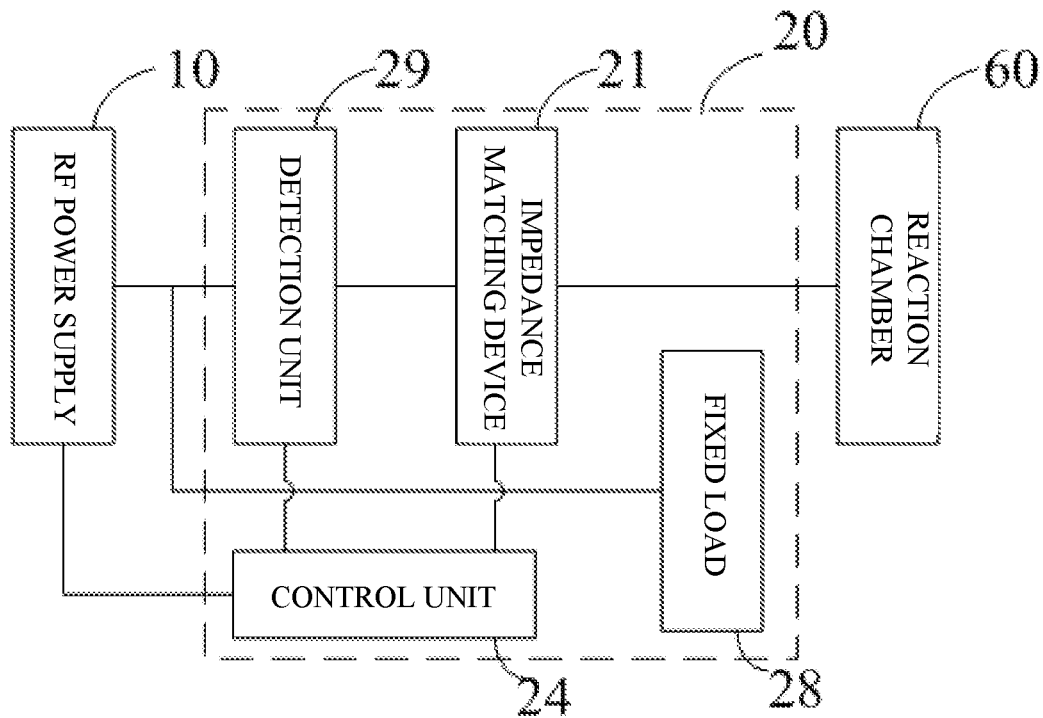
FIG. 6 is a functional block diagram illustrating a second impedance matching system according to some embodiments of the present disclosure.

FIG. 6 illustrates a functional block diagram of a second impedance matching system according to some embodiments of the present disclosure. The impedance matching system 20, which may be provided between an RF power supply 10 and a reaction chamber 60, may include a detection unit 29, an impedance matching device 21, a control unit 24 and a fixed load 28. The detection unit 29 may be configured to detect an output signal of the RF power supply 10 and a value of reflected power in real time, and to transmit the same to the control unit 24. The impedance matching device 21 may be configured to enable an output impedance of the RF power supply 10 to match an input impedance of the impedance matching system 20. The fixed load 28 may have an impedance that is equal to the output impedance of the RF power supply 10. For example, in a case where the input impedance of the RF power supply 10 is 50 ohms, the fixed load 28 having the impedance of 50 ohms may be employed. The control unit 24 may be configured to perform a switch between a matching mode and a hold mode according to a preset timing sequence, i.e., to selectively connect the RF power supply 10 to the reaction chamber 60 or connect the RF power supply 10 to the fixed load 28. In some embodiments of the present disclosure, the matching mode may refer to a mode in which the control unit 24 controls the continuous wave power output from the RF power supply 10 to be loaded to the reaction chamber 60 via the impedance matching device 21; and the hold mode may refer to a mode in which the control unit 24 controls the continuous wave power output from the RF power supply 10 to be loaded onto the fixed load 28.

During a current process, the RF power supply 10 may always output the continuous wave power, and the continuous wave output of the RF power supply 10 may be converted, according to a preset timing sequence, into a pulse sequence output supplied to the reaction chamber 60 and the fixed load 28, respectively. Further, in a case where the RF power supply 10 is connected to the reaction chamber 60, an initial matching position of the impedance matching device 21 may be set as a matching position at an ending time point of a previous connection between the RF power supply 10 and the reaction chamber 60, and the impedance matching device 21 may automatically perform the matching. In a case where the RF power supply is connected to the fixed load 28, the impedance matching device 21 may be kept at its current matching position. Alternatively, after the impedance matching is completed in a first-time matching mode, the impedance matching device 21 may be always kept at its current matching position without any changes. Accordingly, the impedance matching system provided by the present embodiments can avoid the occurrence of the overshoot phenomenon when the pulsed RF power signal is loaded to the reaction chamber, and can improve the matching speed, matching precision and matching stability while reducing the system costs.

Figure 7:
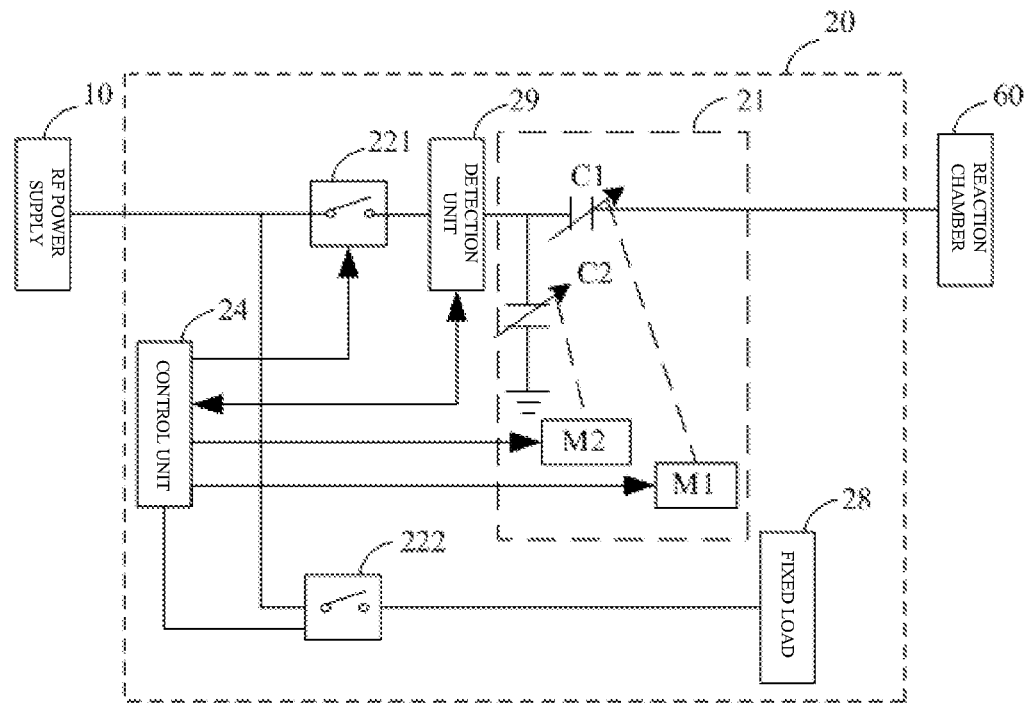
FIG. 7 is a functional block diagram illustrating a third impedance matching system according to some embodiments of the present disclosure.

FIG. 7 is a functional block diagram illustrating a third impedance matching system according to some embodiments of the present disclosure. The structure and functions of the impedance matching system 20 are further refined in the present embodiments on the basis of the embodiments shown in FIG. 6. Further, the selector switch in the present embodiment may include a first switch 221 and a second switch 222, thereby enabling the RF power supply 10 to be selectively connected to the reaction chamber 60 or to the fixed load 28 under a control of the control unit 24, the first switch 221 and the second switch 222. In some embodiments, the first switch 221 may be configured to connect or disconnect the RF power supply 10 and the impedance matching device 21. That is, the first switch 221 may be configured to connect or disconnect the RF power supply 10 and the reaction chamber 60, and the second switch 222 may be configured to connect or disconnect the RF power supply 10 and the fixed load 28. The control unit 24 may include a switch control module (not shown) configured to turn on or turn off the first switch 221 and the second switch 222 according to a preset timing sequence, such that the RF power supply 10 is connected to the reaction chamber 60 or the RF power supply 10 is connected to the fixed load 28. In some embodiments, the switch control module may be configured to turn on the first switch 221 and turn off the second switch 222 when the matching mode is switched on, and at this time, the continuous wave power of the RF power supply 10 may be loaded onto the reaction chamber 60 via the impedance matching device 21. The switch control module may be configured to turn on the second switch 222 and turn off the first switch 221 when the hold mode is switched on, and at this time, the continuous wave power of the RF power supply 10 may be loaded onto the fixed load 28 and no RF energy is input to the impedance matching device 21 and the reaction chamber 60. In other words, the control unit 24 may be configured to control the first switch 221 and the second switch 222 to be turned on, alternately, according to the preset timing sequence, thereby enabling the continuous wave output of the RF power supply 10 to be converted into a pulse sequence output supplied to the reaction chamber 60 and the fixed load 28, respectively. As such, instead of the pulse wave power output of an existing RF power supply, only an RF power supply having a continuous wave power output function may be adopted, and the cost of using the RF power supply can be reduced.

Further, the control unit 24 may be first switched to the matching mode when a process starts, so that the impedance matching device 21 automatically performs the impedance matching in the first-time matching mode. After the matching is completed, when the RF power supply 10 is connected to the reaction chamber 60 subsequently, an initial matching position of the impedance matching device 21 may be set as the matching position at the ending time point of the previous connection between the RF power supply 10 and the reaction chamber 60, and the impedance matching device 21 may automatically perform the matching; and when the RF power supply 10 is connected to the fixed load 28 subsequently, the impedance matching device may be kept at its current matching position. Alternatively, in any subsequent matching mode or hold mode, the matching position of the impedance matching device 21 may be kept unchanged until the completion of the whole process. In actual applications, each of the first switch 211 and the second switch 222 may adopt an on-off switch such as a relay, a diode switch or an RF switch.

In the present embodiments, the impedance matching device 21 may include two variable capacitors (C1, C2) and two control motors (M1, M2), and the two control motors (M1, M2) are configured to adjust the capacitances of the two variable capacitors (C1, C2), respectively. In the first-time matching mode, the control unit 24 may calculate based on a value of reflected power transmitted from the detection unit 29 and a matching algorithm to obtain target values of the capacitances of the two variable capacitors (C1, C2), and control the two control motors (M1, M2) respectively to adjust values of the capacitances of the two variable capacitors (C1, C2) to the target values of the capacitances. The target values of the capacitances are the capacitances of the variable capacitors when the output impedance of the RF power supply 10 matches the input impedance of the impedance matching system 20.

Figure 8:
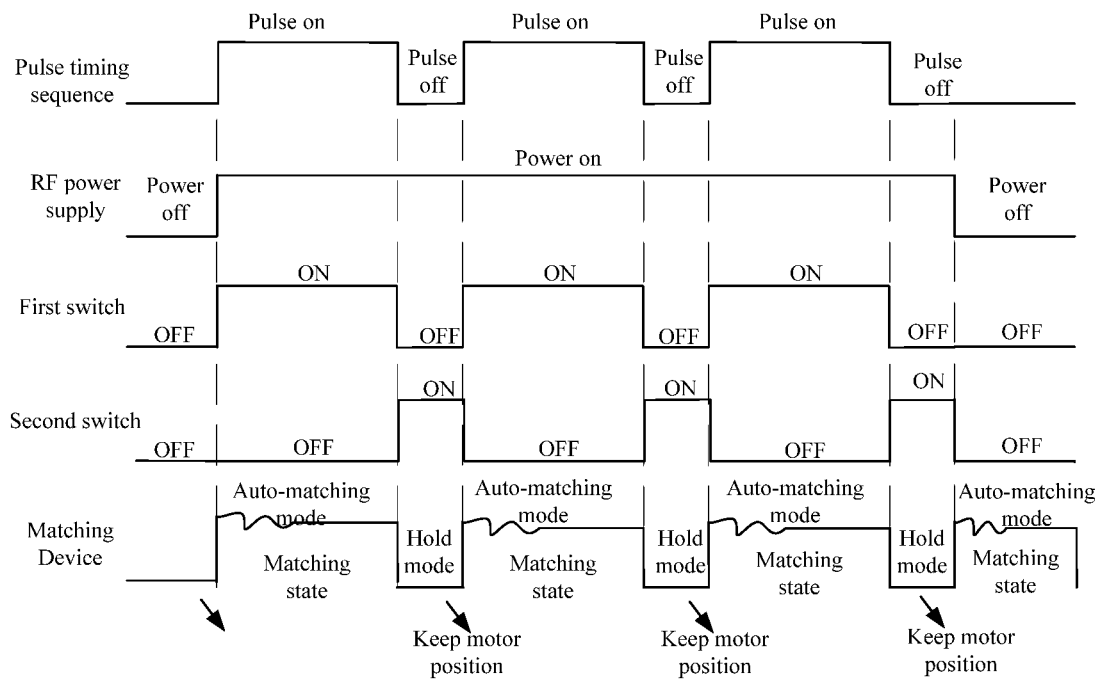
FIG. 8 is a timing diagram illustrating operations of the impedance matching system of FIG. 7 according to some embodiments of the present disclosure.

In the following, an operation mode of the impedance matching system provided by the present embodiments will be described in detail with reference to an operation timing diagram illustrated in FIG. 8. In this operation mode, when the RF power supply 10 is connected to the reaction chamber 60, the initial matching position of the impedance matching device 21 may be set as the matching position at the ending time point of the previous connection between the RF power supply 10 and the reaction chamber 60. As illustrated in FIG. 8, a preset timing sequence of the control unit 24 may be set in advance, and the preset timing sequence may be set in a manner as follows: a frequency and time of connecting, by the first switch 221, the RF power supply 10 and the impedance matching device 21 and a frequency and time of connecting, by the second switch 222, the RF power supply 10 and the fixed load 28 may be calculated respectively according to a frequency and a duty cycle of a pulse required by a process, i.e., a frequency and a duty cycle of a pulse wave output by an existing RF power supply. The calculated frequencies and duty cycles may be respectively stored in the switch control modules of the control unit 24 corresponding to the first switch 221 and the second switch 222, thereby achieving control of on/off states of each of the first switch 221 and the second switch 222 according to the preset timing sequence. For example, in a case where a pulse having a frequency of 1000 Hz and a duty cycle of 70% is required to be loaded, a switched-on time of the first switch 221 in the first-time matching mode is 0.7 ms, which is a switched-off time of the second switch 222; the switched-on time of the second switch 222 in the hold mode is 0.3 ms, which is the switched-off time of the first switch 221, while the first switch 221 and the second switch 222 each has an on-off frequency of 1000 Hz. During a process, the control unit 24 controls on/off states of the first switch 221 and the second switch 222 based on the above-described on/off times and frequencies. In actual applications, the frequency of the pulse required by a process may be set to 400 KHz, 2 MHz, 13 MHz, 27 MHz, 40 MHz, 60 MHz or other frequencies according to specific situations, and the present disclosure has no particular limitation thereto.

When a process starts, the RF power supply 10 may be turned on, and the RF power supply 10 may be maintained to output continuous wave power. At the same time, the control unit 24 may be first switched to the matching mode, in which the first switch 221 may be switched on and the second switch 222 may be switched off, and the detection unit 29 may be configured to automatically detect the input signal of the RF power supply 10 and the value of reflected power, and may transmit the same to the control unit 24.

Upon receiving the input signal and the value of reflected power, the control unit 24 may perform a calculation based on the value of reflected power and a preset matching algorithm. In some embodiments, the target values of the capacitances of the two variable capacitors (C1, C2) may be calculated and compared with the current values of the capacitances of the two variable capacitors (C1, C2), respectively, and based on the result of the comparison, control signals may be transmitted to the two control motors (M1, M2), respectively. Based on the control signals, the two control motors (M1, M2) may be configured to adjust the values of the capacitances of the two variable capacitors (C1, C2) respectively until these values are equal to the target values of the capacitances, thereby enabling the output impedance of the RF power supply 10 to match the input impedance of the impedance matching system 20, that is, the impedance matching device 21 completing the impedance matching operation.

After the impedance matching device 21 completes the impedance matching operation, the control unit 24 may be switched to the hold mode, in which the second switch 222 may be switched on and the first switch 221 may be switched off, the continuous wave power of the RF power supply 10 may be loaded onto the fixed load 28, and there may be no RF energy input to the impedance matching device 21 and the reaction chamber 60. In the subsequent procedure, as illustrated in FIG. 8, the RF power supply 10 may be configured to keep outputting the continuous wave power, and when the first switch 221 is in an ON state and the second switch 222 is in an OFF state, i.e., when the RF power supply 10 is connected to the reaction chamber 60, the initial matching position of the impedance matching device 21 may be the matching position at the ending time point of the previous connection between the RF power supply 10 and the reaction chamber 60; when the first switch 221 is in an OFF state and the second switch 222 is in an ON state, the impedance matching device 21 may be controlled to keep its current matching position unchanged. The control unit 24 may control the first switch 221 and the second switch 222 to be switched on, alternately, according to the preset timing sequence, thereby enabling the continuous wave output of the RF power supply 10 to be converted into a pulse sequence output supplied to the impedance matching device 21 and the reaction chamber 60, respectively, until the end of the process. When the process is required to be switched, the RF power supply 10 is required to be turned off, and the output of the whole pulse timing sequence may restart and the impedance matching device 21 may restart to perform the impedance matching.

In actual applications, when the first-time matching mode is enabled, in a case where the switch-on time of the first switch 221 is not sufficient for the impedance matching device 21 to complete the impedance matching operation (i.e., the impedance matching device 21 does not achieve a matched state during the switch-on time period of the first switch 221), the switch-on time of the first switch 221 may be appropriately prolonged, and once the impedance matching device 21 completes the impedance matching operation, the first switch 221 is switched off and the second switch 222 is switched on.

It should be noted that, in the present embodiments, the impedance matching device 21 may adopt an L-shaped matching network structure, in which the two variable capacitors (C1, C2) and the two control motors (M1, M2) are used for achieving the impedance matching. However, the present disclosure is not limited thereto, and in actual applications, the matching device may adopt a matching network structure having an "inverted L" shape, a "T" shape, a "x" shape or any other shape according to specific situations.

Figure 9:
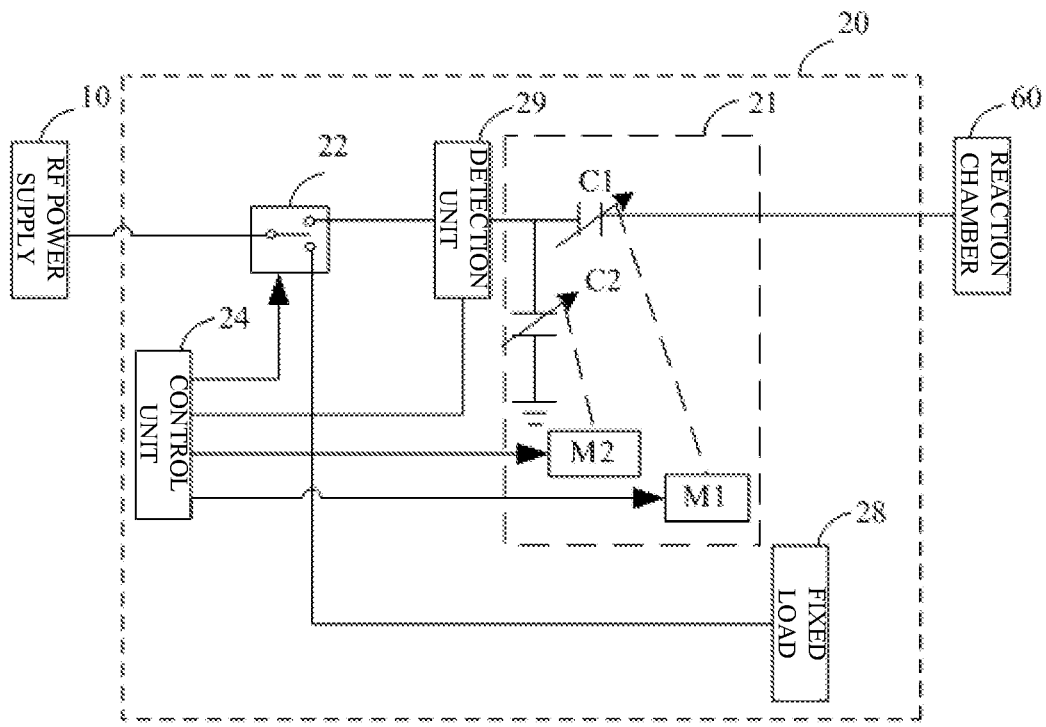
FIG. 9 is a functional block diagram illustrating a fourth impedance matching system according to some embodiments of the present disclosure.

FIG. 9 is a functional block diagram of a fourth impedance matching system according to some embodiments of the present disclosure. Referring to FIG. 9, the impedance matching system provided by the present embodiments is different from that of the embodiments shown in FIG. 7 in that a change-over switch 22 is employed instead of the first switch 221 and the second switch 222. In the present embodiments, the RF power supply 10 may be enabled to be selectively connected to the reaction chamber 60 and the fixed load 28 by means of the control unit 24 and the change-over switch 22. In some embodiments, the change-over switch 22 may be configured to selectively connect the RF power supply 10 and the impedance matching device 21 or connect the RF power supply 10 and the fixed load 28. The control unit 24 may be configured to control the change-over switch 22 to connect the RF power supply 10 and the impedance matching device 21 in the matching mode and to control the change-over switch 2 to connect the RF power supply 10 and the fixed load 28 in the hold mode.

Similar to the settings of the switched-on times and the frequencies of the first switch 221 and the second switch 222 in the above embodiments shown in FIG. 7, the preset timing sequence of the control unit 24 may be set in a manner as follows: a frequency and time period of connecting the RF power supply 10 and the impedance matching device 21 by the change-over switch 22 and a frequency and time of connecting the RF power supply 10 and the fixed load 28 by the change-over switch 22 may be calculated respectively according to a frequency and a duty cycle of a pulse required by a process.

It should be noted that, in the above embodiments shown in FIGS. 6, 7, and 9, the load circuit may be provided with the fixed load 28 therein, and the impedance matching device 21 is connected in series with the reaction chamber 60 and further connected in parallel with the fixed load 28, and further connected to the rear end of the RF power supply 10 via the selector switch. The so-called rear end is defined with respect to the transmission direction of the power in the circuit, i.e., the rear end is at the output end of the RF power supply 10 in the transmission direction of the power.

It should also be noted that, in the above embodiments shown in FIGS. 6, 7, and 9, the control unit 24 may have functions including a writing/reading function for writing in the frequencies and times of the first switch 221 and the second switch 222, a function of controlling the on/off states of the first switch 221 and the second switch 222, and a function of calculating and controlling the matching operation of the impedance matching device 21 or keeping the matching position unchanged. In actual applications, in every matching mode and every hold mode subsequent to the successful first-time matching, the control unit 24 may enable the impedance matching device 21 to keep at the matching position at a time when the first-time matching is successful. Alternatively, when the RF power supply 10 is connected to the reaction chamber 60, the initial matching position of the impedance matching device 21 may be set as the matching position at the ending time point of the previous connection between the RF power supply 10 and the reaction chamber 60. As such, the matching can be performed in real time during the process, thereby further improving the speed and precision of the matching.

As another technical solution, embodiments of the present disclosure further provide a semiconductor processing apparatus, which includes an RF power supply, a reaction chamber and an impedance matching system arranged between the RF power supply and the reaction chamber. The impedance matching system may adopt any of the impedance matching systems provided by the above embodiments of the present disclosure.

In actual applications, the semiconductor processing apparatus may be an inductively coupled plasma processing apparatus or a capacitively coupled plasma processing apparatus.

The semiconductor processing apparatus provided by the embodiment of the present disclosure may adopt the impedance matching system provided by any of the above embodiments of the present disclosure. As such, the RF power supply may always operate in the continuous wave mode, and the power signal actually obtained by the reaction chamber may include a pulsed RF power signal by controlling a switch between a connection of the RF power supply with the reaction chamber and a connection of the RF power supply with the load circuit according to preset timing sequence, such that the reaction chamber can obtain a pulsed RF power signal without additional arrangement of the pulsed RF power supply, thereby reducing the costs of the system. Meanwhile, when the pulsed RF power signal is loaded to the reaction chamber, the overshoot phenomenon in the prior art caused by the loading of the pulsed RF power signal directly transmitted from the pulsed RF power supply can be avoided. Moreover, since the impedance matching device can automatically perform the impedance matching when the RF power supply is switched to be connected to the reaction chamber, the matching stability and matching precision can be improved.

As another technical solution, embodiments of the present disclosure further provide an impedance matching method, to which an impedance matching system including an impedance matching device may be applied. The impedance matching device may be connected to an RF power supply and a reaction chamber, respectively, and configured to perform the impedance matching on the output impedance of the RF power supply and the input impedance of the impedance matching device. The impedance matching method includes the following steps of:

controlling the RF power supply to be selectively connected to the reaction chamber and connected to a load circuit according to a preset timing sequence, and converting, through the impedance matching device, a continuous wave output of the RF power supply to a pulse output to be loaded to the reaction chamber, wherein the load circuit is a load for the RF power supply in addition to the reaction chamber; and automatically performing an impedance matching by the impedance matching device when the RF power supply is connected to the reaction chamber.

In actual applications, in some embodiments, the impedance matching method may further include determining whether it is required to switch a process. If it is required, the method may further include turning off the RF power supply, restarting output of whole pulse sequence, and restarting the impedance matching by the impedance matching device; and if it is not required, determining whether the process is completed. If it is determined that the process is not completed, the method may further include continuing to perform the above impedance matching method, and if it is determined that the process is completed, the method may further include turning off the RF power supply and terminating the process.

In actual applications, in a case where an adjustable load is provided by the load circuit, an impedance of the adjustable load may be adjusted to a preset impedance when the RF power supply is connected to the load circuit, wherein the preset impedance is an input impedance of the reaction chamber at the ending time point of the previous connection between the RF power supply and the reaction chamber.

In actual applications, in a case where the load circuit is only provided with a fixed load, when the RF power supply is connected to the reaction chamber, an initial matching position of the impedance matching device may be set as a matching position at the ending time point of the previous connection between the RF power supply and the reaction chamber; alternatively, the impedance matching device is always kept at a matching position at a time when a first-time matching is successful, in every matching mode and every hold mode subsequent to the successful first-time matching.

Figure 10:
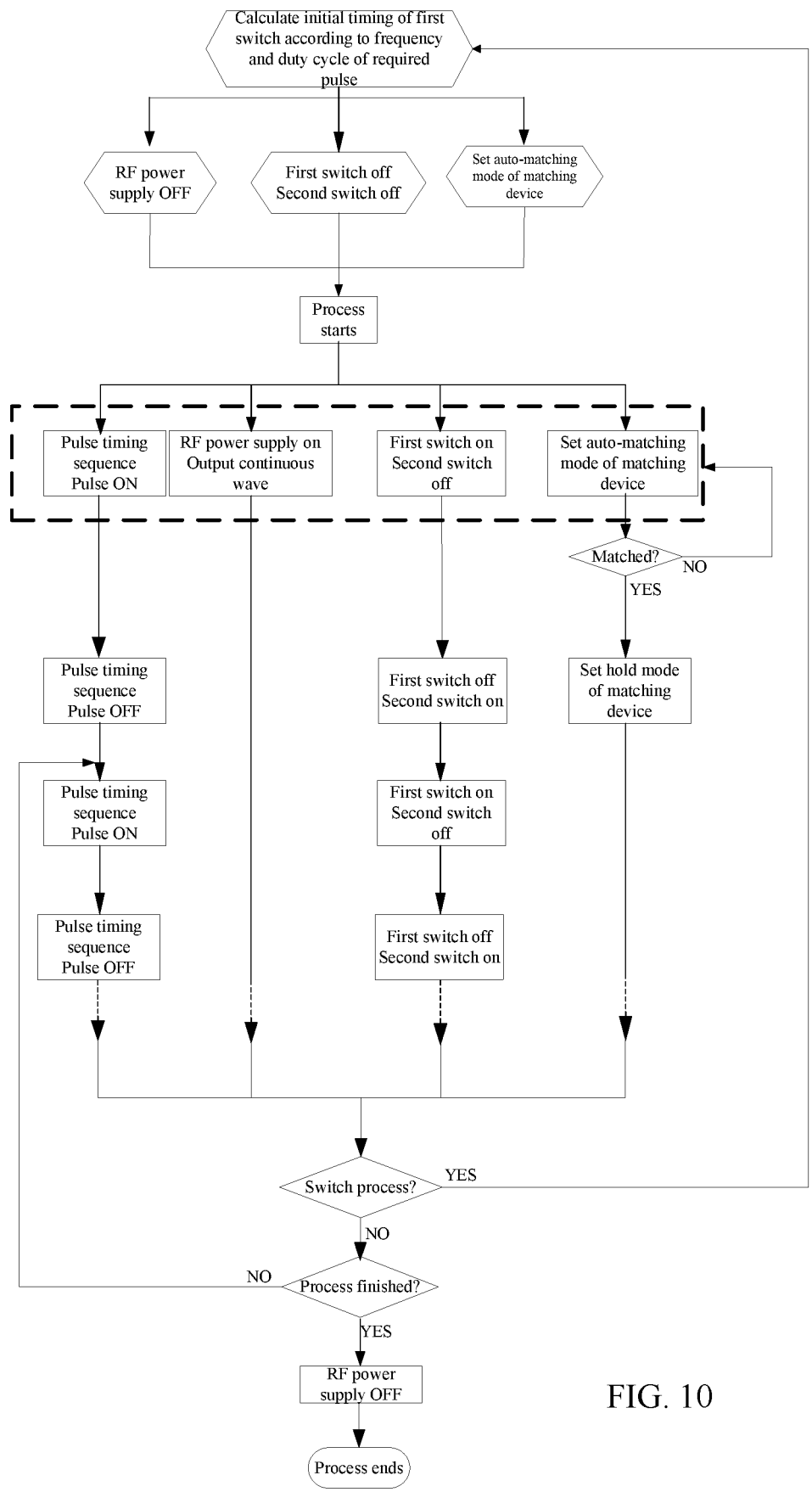
FIG. 10 is a flowchart illustrating operations of an impedance matching method according to some embodiments of the present disclosure.

In the following, the impedance matching method provided by the embodiments of the present disclosure will be described in detail by taking the case of using the impedance matching system provided by the embodiments of FIG. 7 to perform the impedance matching as an example. In the present embodiments, the impedance matching system may operate in another operation mode different from that illustrated in FIG. 8; i.e., in every matching mode and every hold mode subsequent to the successful first-time matching, the impedance matching device 21 is always kept at the matching position at a time when the first-time matching is successful. Referring to FIG. 10, before a process starts, a frequency and a time of connecting the RF power supply 10 and the impedance matching device 21 by the first switch 221 may be calculated in advance according to a frequency and a duty cycle of a pulse required by a process. Moreover, the RF power supply 10 may be in an OFF state, the first switch 221 and the second switch 222 may be each in an OFF state, and the impedance matching device 21 may be in the auto-matching mode. During the current process, the following operations are performed sequentially.

At a first stage, the RF power supply 10 may be turned on, and the RF power supply 10 may be always maintained to output continuous wave power. The first switch 221 may be switched on and the second switch 222 may be switched off, and the impedance matching device 21 may be in the auto-matching mode, i.e., the impedance matching operation may be performed. It is further determined whether an output impedance of the RF power supply 10 completely matches an input impedance of the impedance matching device 21. If they match, the method may proceed to a second stage. If they do not match, the first stage may be repeated.

At the second stage, the control unit 24 performs a switch between the hold mode and the matching mode according to a preset timing sequence, i.e., controls the first switch 221 and the second switch 222 to be switched on alternately according to the preset timing sequence, thereby enabling the continuous wave output of the RF power supply 10 to be converted into a pulse sequence output supplied to the impedance matching device 21 and the reaction chamber 60, respectively. Meanwhile, the RF power supply 10 is always maintained to output the continuous wave power, and the impedance matching device 21 is controlled to keep its current matching position unchanged until end of the current process.

At a third stage, it is determined whether it is required to switch the process. If it is required, the RF power supply 10 is required to be turned off, output of whole pulse sequence restarts, and the impedance matching device 21 restarts the impedance matching, i.e., the operation of the first stage is repeated; and if it is not required, it is determined whether the process is completed, if it is determined that the process is not completed, the operation of the second stage is repeated, and if it is determined that the process is completed, the RF power supply 10 is turned off.

According to the impedance matching method provided by the embodiments of the present disclosure, compared to the prior art, the overshoot phenomenon in the prior art caused by the loading of the pulsed RF power signal directly transmitted from the pulsed RF power supply can be avoided when the pulsed RF power signal is loaded to the reaction chamber, because the pulsed RF power signal is not directly transmitted from the RF power supply. Moreover, since the impedance matching device automatically performs the impedance matching when the RF power supply is switched to be connected to the reaction chamber, the phenomenon of unstable matching and unrepeatable matching can be alleviated in the simulated pulse mode, thereby ensuring the matching precision and speed. Further, since the expensive RF power supply with a pulse mode function is not required, the cost can be reduced, and the economic benefit can be improved.

It should be noted that the so-called auto-matching in the present disclosure should include the following cases: the matching is achieved by keeping the matching position of the adjustable impedance of the impedance matching device unchanged; alternatively, the matching is achieved by changing the matching position of the adjustable impedance of the impedance matching device. That is to say, in the present disclosure, regardless of whether the matching position of the adjustable impedance of the impedance matching device needs to be adjusted, it is considered as automatically performing the impedance matching on the output impedance of the RF power supply and the input impedance of the impedance matching device as long as the purpose of matching the output impedance of the RF power supply and the input impedance of the impedance matching device can be achieved.

It should also be understood that the foregoing implementations are merely exemplary embodiments for illustrating the principle of the present disclosure, but the present disclosure is not limited thereto. Various modifications and improvements may be made for those of skilled in the art without departing from the spirit and essence of the present disclosure. Accordingly, these modifications and improvements are also construed as the protection scope of the present disclosure.

What is claimed is:

1. An impedance matching system, comprising:
    an impedance matching device, arranged between a radio frequency (RF) power supply and a reaction chamber, adapted to connect the RF power supply to the reaction chamber through a switch, and configured to automatically perform an impedance matching on an output impedance of the RF power supply and an input impedance of the impedance matching device;
    the switch and a load circuit; and
    a control unit, configured to control the switch to connect the RF power supply to the reaction chamber or connect the RF power supply to the load circuit according to a preset timing sequence, wherein:
        the switch is configured, according to the preset timing sequence, to enable the RF power supply to be selectively connected to the reaction chamber or to the load circuit, and the impedance matching device is configured to convert a continuous wave output of the RF power supply into a pulse output according to the preset timing sequence, and provide the pulse output to the reaction chamber, and
        the preset timing sequence is obtained based on a frequency and a duty cycle of a pulsed RF signal required by a process.

2. The impedance matching system according to claim 1, wherein:
    an adjustable load is provided by the load circuit; and
    the control unit comprises:
        a switch control module, configured to control, according to the preset time sequence, the switch to enable the RF power supply to be connected to the reaction chamber or enable the RF power supply to be connected to the load circuit; and
        a load control module, configured to adjust an impedance of the adjustable load to be a preset impedance when the switch connects the RF power supply to the load circuit, the preset impedance being an input impedance of the reaction chamber at an ending time point of a previous connection between the RF power supply and the reaction chamber.

3. The impedance matching system according to claim 2, wherein: the adjustable load is connected in parallel with the reaction chamber and connected to a rear end of the impedance matching device via the switch.

4. The impedance matching system according to claim 1, wherein:
    a fixed load is provided in the load circuit, and
    the control unit comprises a switch control module configured to control, according to the preset time sequence, the switch to enable the RF power supply to be connected to the reaction chamber or enable the RF power supply to be connected to the load circuit.

5. The impedance matching system according to claim 4, wherein:
    the impedance matching device is connected in series with the reaction chamber, and
    the impedance matching device and the reaction chamber connected in series are connected in parallel with the fixed load, and further connected to a rear end of the RF power supply via the switch.

6. The impedance matching system according to claim 4, wherein: the control unit is further configured to set an initial matching position of the impedance matching device as a matching position at an ending time point of a previous connection between the RF power supply and the reaction chamber when the switch connects the RF power supply to the reaction chamber.

7. The impedance matching system according to claim 2, further comprising a detection unit, wherein:
    the control unit further comprises a matching control module, and
    the impedance matching device comprises an impedance adjustment unit and an actuator unit, wherein:
        the impedance adjustment unit is provided in a transmission line between the RF power supply and the reaction chamber;
        the detection unit is configured to detect a signal in the transmission line at a front end of the impedance adjustment unit, and to transmit the signal to the matching control module;
        the matching control module is configured to obtain a control signal based on the signal transmitted from the detection unit, and to transmit the control signal to the actuator unit; and the actuator unit is configured to adjust an impedance of the impedance adjustment unit based on the control signal to perform the impedance matching.

8. The impedance matching system according to claim 7, wherein:
the switch has a preset initial state in which the RF power supply is connected to the reaction chamber; and
the matching control module is further configured to:
determine in real time, under the initial state of the switch, whether current matching is successful based on the signal transmitted from the detection unit; and
transmit a start-up instruction to the switch control module if the current matching is successful, and continue the impedance matching if the current matching is not successful.

9. The impedance matching system according to claim 7, wherein:
the impedance adjustment unit comprises an adjustable capacitor, and
the actuator unit comprises a drive motor configured to adjust a capacitance of the adjustable capacitor.

10. The impedance matching system according to claim 9, wherein:
a target capacitance of the adjustable capacitor is calculated by the control unit based on reflected power transmitted from the detection unit, and
the capacitance of the adjustable capacitor is adjusted to the target capacitance.

11. The impedance matching system according to claim 10, wherein the target capacitance is a capacitance of the adjustable capacitor when the output impedance of the RF power supply matches the input impedance of the impedance matching system.

12. The impedance matching system according to claim 2, wherein the switch comprises:
two separate switches, configured to be connected between the reaction chamber and the RF power supply and between the load circuit and the RF power supply, respectively; and
the switch control module is configured to selectively control, according to the preset timing sequence, the two separate switches to be turned on or turned off.

13. The impedance matching system according to claim 12, wherein the separate switch is a relay, a diode or an RF switch.

14. The impedance matching system according to claim 12, wherein the switch control module is configured to control the two separate switches to have opposite phases of on-states and off-states.

15. The impedance matching system according to claim 2, wherein the switch comprises a change-over switch at least having one moving contact and two static contacts, the moving contact being connected with the RF power supply, one of the two static contacts being connected with the reaction chamber, and the other one of the two static contacts being connected with the load circuit.

16. The impedance matching system according to claim 1, wherein a signal of the preset timing sequence includes a frequency and a duty cycle of the pulsed RF signal required by the process.

17. An impedance matching method for performing an impedance matching on an output impedance of a radio frequency (RF) power supply and an input impedance of an impedance matching device, the method comprising:
providing a load circuit and a reaction chamber;
providing a switch and configuring the switch, according to a preset timing sequence, to enable the RF power supply to be selectively connected to the reaction chamber or connected to the load circuit, converting a continuous wave output of the RF power supply to a pulse output according to the preset timing sequence, and providing the pulse output to the reaction chamber, the preset timing sequence being obtained based on a frequency and a duty cycle of a pulsed RF signal required by a process; and
automatically performing the impedance matching on the output impedance of the RF power supply and the input impedance of the impedance matching device, when the RF power supply is connected to the reaction chamber.

18. The impedance matching method according to claim 17, wherein, in a case where an adjustable load is provided in the load circuit, an impedance of the adjustable load is adjusted to a preset impedance when the RF power supply is connected to the load circuit, the preset impedance being an input impedance of the reaction chamber at an ending time point of a previous connection between the RF power supply and the reaction chamber.

19. The impedance matching method according to claim 17, wherein, in a case where only a fixed load is provided in the load circuit, an initial matching position of the impedance matching device is set as a matching position at an ending time point of a previous connection between the RF power supply and the reaction chamber when the RF power supply is connected to the reaction chamber.

20. A semiconductor processing apparatus, comprising the impedance matching system according to claim 1, the radio frequency (RF) power supply, and the reaction chamber.

* * * * *